(12) United States Patent
Choi et al.

(10) Patent No.: US 7,727,889 B2
(45) Date of Patent: Jun. 1, 2010

(54) METHOD FOR FORMING FINE PATTERN BY SPACER PATTERNING TECHNOLOGY

(75) Inventors: Ik Soo Choi, Icheon-si (KR); Sung Yoon Cho, Suwon-si (KR)

(73) Assignee: Hynix Semiconductor Inc, Icheon-si (KR)

( * ) Notice: Subject to any disclaimer, the term of this patent is extended or adjusted under 35 U.S.C. 154(b) by 0 days.

(21) Appl. No.: 12/164,754

(22) Filed: Jun. 30, 2008

(65) Prior Publication Data
US 2009/0269924 A1    Oct. 29, 2009

(30) Foreign Application Priority Data
Apr. 29, 2008    (KR) .................. 10-2008-0040098

(51) Int. Cl.
*H01L 21/44*    (2006.01)
(52) U.S. Cl. .................. 438/669; 257/E21.24
(58) Field of Classification Search .................. 438/669, 438/706
See application file for complete search history.

(56) References Cited
U.S. PATENT DOCUMENTS

2001/0004921 A1* 6/2001 Winniczek et al. .......... 156/345
2004/0142251 A1   7/2004 Hsu et al.
2006/0134909 A1* 6/2006 Nagase et al. ............... 438/637
2006/0240361 A1  10/2006 Lee et al.
2007/0212892 A1   9/2007 Caspary et al. ............. 438/736
2007/0249170 A1* 10/2007 Kewley ...................... 438/706
2009/0154214 A1* 6/2009 Sugimae et al. ............... 365/51

* cited by examiner

*Primary Examiner*—W. David Coleman
*Assistant Examiner*—Christine Enad
(74) *Attorney, Agent, or Firm*—Marshall, Gerstein & Borun LLP

(57) ABSTRACT

In a method for forming a fine pattern, a target layer to be patterned is formed on a semiconductor substrate and a polysilicon layer is formed on the target layer. A partition is then formed on the polysilicon layer with an amorphous carbon layer pattern. A spacer is attached to a sidewall of the partition. Thereafter, the spacer is divided into bar patterns by selectively removing the partition. A polysilicon layer pattern is formed by selectively etching a portion of the poly silicon layer exposed by the divided bar patterns and then a target layer pattern is formed by selectively etching a portion of the target layer exposed by the polysilicon layer pattern.

7 Claims, 6 Drawing Sheets

METHOD FOR FORMING FINE PATTERN BY SPACER PATTERNING TECHNOLOGY

CROSS-REFERENCE TO RELATED APPLICATION

Priority to Korean patent application number 10-2008-0040098, filed on Apr. 29, 2008, the disclosure of which is incorporated by reference in its entirety, is claimed.

BACKGROUND OF THE INVENTION

The invention relates generally to a semiconductor device and, more particularly, to a method for forming a fine pattern by a spacer patterning technology.

As the sizes of circuit patterns constituting semiconductor devices decrease, there occurs a limitation in an optical resolution in an exposure process that transcribes the pattern onto a wafer. A Spacer Patterning Technology (SPT) has been introduced as a method for overcoming the limitation in the optical resolution and forming finer patterns. In SPT, a spacer is formed on a wafer and an etch target layer under the spacer is selectively patterned using the spacer as an etch mask, thereby forming a fine pattern having a line width determined as a function of the thickness of the spacer. This SPT is expected to overcome the resolution limitation in ArF exposure equipment and thus to be useful to realize a fine pattern having a line width of 40 nm on a wafer.

In SPT, the spacer is formed by a spacer etch with respect to a layer for the spacer. In order to divide the spacers from the spacer layer, the spacer layer is deposited so as to cover a sacrificial pattern or a partition. The spacer etch that is an anisotropic etch is performed on the spacer layer to form the spacers attached to the both side walls of the partition. Therefore, a process for patterning the partitions is primarily required to form the spacer.

To pattern these partitions, a photoresist layer is applied onto a partition layer and a layout of the partition is exposed and transcribed onto the photoresist layer. Thereafter, the exposed photoresist layer is developed to form a photoresist pattern. However, since the ArF light source used to the exposure has quite a short frequency, there is a limitation in a thickness of the photoresist layer capable that can realize the pattern from the result of accurate exposure and development. Since there is a limitation in the ability to increase the thickness of the photoresist pattern, there is also a limitation in a thickness of the partition layer patternable by a selective etch process using this photoresist pattern. Since there is a limitation in the ability to increase the thickness of the partition layer, it is also difficult to ensure that the partition patterned from this partition layer has a required, sufficiently high height.

The limitation to the height of the partition ultimately leads to a limitation to a height of the spacer, and the limitation to the height of the spacer result in a limitation to a thickness of a under layer to be patterned by a selective etch performed using the spacer as an etch mask. Since a height of a circuit pattern such as a gate required on a wafer may be hundreds to thousands angstroms, it is difficult to directly use the spacer having a low height, that can only be formed in a limited height, as an etch mask required to selectively etch a layer for the gate.

To overcome this difficulty, a hard mask capable of realizing a higher etch selectivity to a pattern target layer is introduced. Layers for the hard mask are introduced as a multi-layer stack into a lower side of the spacer so that the hard mask can have a sufficient height and can be accurately transcribed with a shape of the pattern from the spacer having relatively low height. An upper layer introduced into relatively upper side of the multilayer stack acts as a sub mask for etching the lower layer, thereby more accurately transcribing the shape of the spacer onto the lower-most layer. In the case of introducing the hard mask of the multilayer stack as described above, thicknesses and stacking order of the layers constituting the stack are determined in consideration of extents of realization of the etch selectivities among the layers.

As described above, the layer for the hard mask is introduced as a stack structure having a large number of layers and a partition layer for attaching the spacer is further stacked on the hard mask stack. Therefore, the entire stack for the spacer patterning has a relatively large number of stacked layers. Accordingly, an excessive thermal stress is caused in the lower layer due to high thermal requirements in a process of depositing the upper layer, and this may result in a lifting phenomenon in the lower layer. This lifting phenomenon due to the thermal stress may be resulted from that layers having different materials are stacked with interfaces therebetween for realizing significant etch selectivities between the layers and thus an interface properties or an adhesive properties becomes weak.

Therefore, it is necessary to exclude the layer having relatively high thermal requirements when depositing the upper layer of the stack. Also, as it is necessary to stack and selectively etch a plurality of layers, an entire process of the SPT becomes very complicated and a process cost is increased. Accordingly, it is necessary to develop a method capable of realizing stacking of layers for the hard mask and the partition through a combination of fewer layers and realizing a stack structure that is relatively stable to the thermal stress.

SUMMARY OF THE INVENTION

Embodiments of the invention are directed to a method for forming a fine pattern using SPT that can introduce an entire stack for hard mask to be transcribed with a layout of a spacer and a partition to be attached with the spacer and can restrict poor stacking due to a thermal stress when forming the stack.

In one embodiment, a method for forming a fine pattern comprises: forming a target layer to be patterned on a semiconductor substrate; forming a polysilicon layer on the target layer; forming a partition on the polysilicon layer with an amorphous carbon layer pattern, said partition defining a sidewall; attaching a spacer to a sidewall of the partition, said spacer having ends; selectively removing the partition; dividing the spacer into bar patterns by selectively removing an end of the spacer; forming a polysilicon layer pattern by selectively etching a portion of the polysilicon layer exposed by the divided bar patterns; and, forming a target layer pattern by selectively etching a portion of the target layer exposed by the polysilicon layer pattern.

The method preferably further comprises, prior to forming the target layer, forming a conductive layer to be selectively etched to a gate using the target layer pattern as an etch mask.

Forming the amorphous carbon layer pattern preferably comprises: forming an amorphous carbon layer on the polysilicon layer; forming a capping layer of silicon oxynitride (SiON) on the amorphous carbon layer; forming a photoresist pattern on the capping layer; and forming the amorphous carbon layer pattern by selectively etching the capping layer and the amorphous carbon layer using the photoresist pattern as an etch mask.

In another embodiment, a method for forming a fine pattern comprises: forming a target layer comprising a silicon oxide layer to be patterned on a semiconductor substrate; forming a polysilicon layer on the target layer in a thickness of ⅓ to ½ of the thickness of the target layer; forming a partition on the polysilicon layer with an amorphous carbon layer pattern having a thickness of 1.2 to 1.5 times the thickness of the polysilicon layer, the partition defining a sidewall; attaching a spacer to the sidewall of the partition, the spacer having ends; selectively removing the partition; dividing the spacer into bar patterns by selectively removing an end of the spacer; forming a polysilicon layer pattern by selectively etching a portion of the polysilicon layer exposed by the divided bar patterns; and, forming a target layer pattern by selectively etching a portion of the target layer exposed by the polysilicon layer pattern.

The method preferably further includes: prior to forming the silicon oxide layer, forming a conductive layer to be selectively etched to a gate using the target layer pattern as an etch mask.

The silicon oxide layer is preferably formed including a plasma enhanced tetraethylothosilicate (PE-TEOS) layer.

In still another embodiment, a method for forming a fine pattern comprises: forming a target layer to be patterned on a semiconductor substrate; forming a polysilicon layer on the target layer; forming a partition on the polysilicon layer with an amorphous carbon layer pattern, the partition defining a sidewall; attaching a spacer to the sidewall of the partition, the spacer having ends; selectively removing the partition; dividing the spacer into bar patterns by selectively removing an end of the spacer; forming a pad mask pattern on a portion of the polysilicon layer exposed by the divided bar patterns; forming a polysilicon layer pattern by selectively etching a portion of the poly silicon layer exposed by the divided bar patterns and the pad mask pattern; and forming a target layer pattern by selectively etching a portion of the target layer exposed by the polysilicon layer pattern.

Forming the pad mask pattern preferably includes: forming a Spin On Carbon (SOC) layer that covers the bar patterns and the polysilicon layer; forming a Multi Functional Hard Mask (MFHM) layer comprising a silicon polymer layer on the SOC layer; forming a second photoresist pattern on the MFHM layer; and forming the pad mask pattern comprising the SOC layer by selectively etching the MFHM layer and the SOC layer using the second photoresist pattern as an etch mask.

According to the embodiments of the invention, an entire stack for a hard mask layer to be transcribed with a layout of a spacer and a partition to be attached with the spacer can be introduced in a stacked structure of fewer layers. Also, since it is possible to restrict stacking degradation due to thermal stress during the process of forming the stack, it is possible to provide a method for forming a fine pattern using SPT that is capable of realizing a fine pattern on a wafer more stably.

DESCRIPTION OF SPECIFIC EMBODIMENTS

A method for forming a fine pattern in accordance with the invention is described in detail below, with reference to the accompanying drawings.

Embodiments of the invention provide a method for forming an entire stack for a hard mask layer to be transcribed with a layout of a spacer and a partition to be attached with the spacer in a three-layer structure including a polysilicon layer, an amorphous carbon layer and a capping layer of silicon oxynitride (SiON). At this time, the polysilicon layer forms a hard mask for a silicon oxide layer introduced as a pattern target layer thereunder, and the amorphous carbon layer forms a layer for the partition to be attached with the spacer. The capping layer is a layer concurrent with the introduction of the amorphous carbon layer, and is introduced so as to cover the amorphous carbon layer to protect the amorphous carbon layer from a subsequent application and development process to a photoresist layer and acts as a hard mask when selectively etching the amorphous carbon layer. This capping layer preferably takes the form of a silicon oxide layer such as a plasma enhanced tetraethylothosilicate (PE-TEOS) layer.

In one embodiment of the invention, since it is possible to realize the partition attached with the spacer and the mask transcribed with the shape of the spacer by using the three-layer stack including the polysilicon layer, the amorphous carbon layer, and the capping layer of the SiON, it is possible to reduce the number of the layers in the stack required to realize the SPT. For example, in order to realize the partition attached with the spacer and the mask transcribed with the layout of the spacer, there may be suggested a second amorphous carbon layer and a second SiON layer on a polysilicon layer that are for the partition, together with the stack of a first amorphous carbon layer, a first SiON layer, and a polysilicon layer that are for the mask. However, this five-layer stack structure can be simplified to a three-layer stack structure. Therefore, a process of forming the stack can be much simplified and cost necessary to form the stack can be reduced.

Also, in an embodiment of the invention, since deposition of the polysilicon layer is performed prior to deposition of the amorphous carbon layer, it is possible to prevent the amorphous carbon layer from being applied with excessive thermal stress due to high temperature thermal requirements accompanied during the deposition of the polysilicon. In an embodiment of the invention, since deposition accompanying large thermal requirements such as the deposition of the polysilicon layer is not performed on the amorphous carbon layer, it is possible to limit degradation of film quality in which the amorphous carbon layer is lifted due to the excessive thermal stress. Consequently, it is possible to more accurately form a fine pattern having a line width of 40 nm level by performing a stable SPT process.

Figure 1:
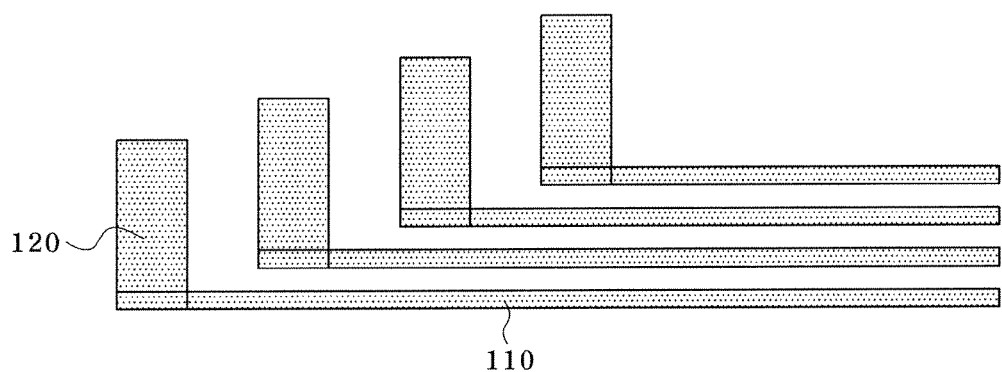
FIGS. 1 and 2 illustrate a layout of a fine pattern according to an embodiment of the invention.
Figure 2:
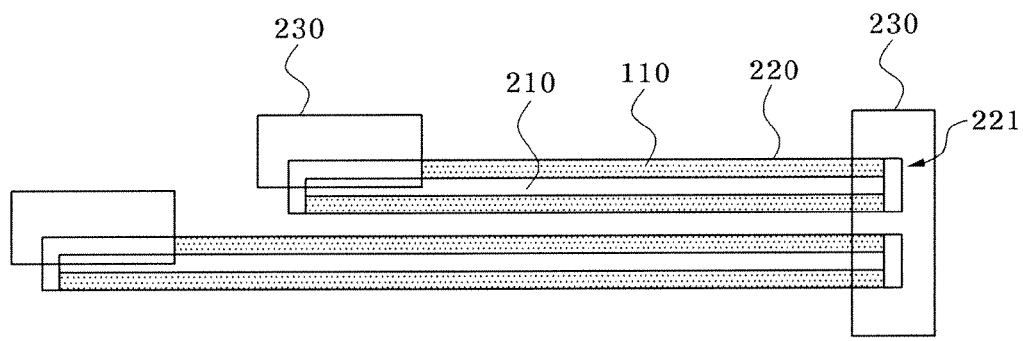

FIGS. 1 and 2 illustrate a layout of a fine pattern according to an embodiment of the invention. FIGS. 3 through 12 illustrate a process of forming the fine pattern according to an embodiment of the invention.

Referring to FIG. 1, a target layout of a fine pattern to be formed according to an embodiment of the invention may be a layout of a gate line 110 of a transistor having a line width of less than 40 nm. The gate line 110 of the transistor constituting a memory cell of a memory semiconductor device is arranged in such a shape that the gate line is elongated and spaced apart from other adjacent line with a predetermined space, i.e. in a shape of line and space pattern. At an end of the gate line 110 is disposed a contact pad 120 for applying a word line signal to a respective gate line 110. Since the contact pad 120 is formed in a pattern having a relatively wide line width compared to that of the gate line 110, the contact pads 120 are designed so as to be elongated in a direction perpendicular to an elongate direction of the gate line 110 in order to ensure a sufficient distance between adjacent pads 120.

Since the target line width of the gate line 110 is preferably about 40 nm, it is difficult to directly transcribe the pattern of the gate line 120 onto a wafer by a typical lithography process using photolithography and etch methods. Therefore, as shown in FIG. 2, the gate line 110 is formed in the SPT process that introduces partitions 210 alternately into the spaces between the gate lines (110 in FIG. 1) and forms a spacer attached to a sidewall of the partition. Since the spacer 220 is attached to the partition 210, the spacer 220 is formed in a rim shape that surrounds the partition. Therefore, a process of selectively removing an end portion 221 of the spacer 220, i.e. a cutting etch process is introduced to divide the spacer 220 into bar patterns that is identical to the respective gate line 110. This cutting etch may be performed in a selective etch process using a mask that opens the end portion of the spacer 220 to an opening region 230.

Figure 3:
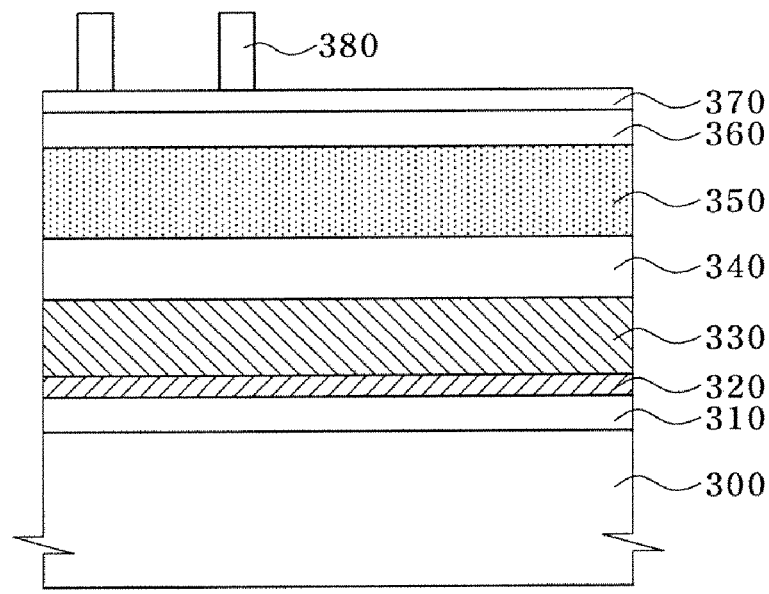
FIGS. 3 through 12 illustrate a process of forming the fine pattern according to an embodiment of the invention.

In the process of performing the SPT using this mask layout, as shown in FIG. 3, a pattern target layer 330 to be patterned with a fine pattern is formed on a semiconductor substrate 300. The pattern target layer 330 is formed to a layer for providing a fine pattern to be used as an etch mask or a hard mask for selectively etching a conductive layer 310 thereunder. For example, the conductive layer 310 to be patterned to the gate line (110 in FIG. 1) of the transistor is formed of a double layer including a polysilicon layer and a tungsten (W) metal layer or a tungsten metal layer, and the target layer 330 is deposited as a layer for providing the etch mask to be used to selectively etch the conductive layer 310. A silicon oxide layer such as PE-TEOS layer formed by a plasma deposition using TEOS is preferably formed to a thickness of about 1400 Å and used as the target layer 330. At this time, the thickness of the target layer 330 may vary in consideration of the thickness of the conductive layer 310 since the thickness of the target layer 330 is set to such a thickness that the target layer can sufficiently act as the etch mask to etch the conductive layer 310.

Between the conductive layer 310 and the target layer 330, a first buffer layer 320 may be introduced as an interlayer to improve interface adhesion. This first buffer layer 320 is preferably formed by depositing an SiON layer to a thickness of about 200 Å.

A polysilicon layer 340 is deposited on the target layer 330 as a layer for providing an etch mask in the selective etch process for patterning the target layer 330 with a fine pattern. At this time, the polysilicon layer 340 is evaluated as a material that can have an etch selectivity of about 1:3 to the PE-TEOS layer introduced as the target layer 330. In an embodiment of the invention, the poly silicon layer 340 is preferably deposited to a thickness of about 800 Å in order to pattern the target layer of PE-TEOS layer preferably having a thickness of about 1400 Å with exclusion of a residual tail. The polysilicon layer 340 is preferably deposited to a thickness of ⅓ to ½ of the thickness of the target layer 330 in consideration of an etch selectivity to the target layer 330 thereunder, a thickness of the target layer 330 and an extent of a recess resulted during a selective etch process for another etch mask to be introduced into the polysilicon layer 340.

An amorphous carbon layer 350 for providing a spacer and a partition to be attached to a sidewall according to the SPT is formed on the polysilicon layer. The amorphous carbon layer 350 is preferably a high temperature amorphous carbon layer that is deposited at a temperature of about 550° C. higher than 350° C. At this time, the amorphous carbon layer 350 is deposited directly on the polysilicon layer 340, and a thickness thereof is set in consideration of a height of a spacer to be used in the selective etch of the polysilicon layer 340. For example, the amorphous carbon layer 350 is preferably formed to a thickness thicker than the thickness of the poly silicon layer 340, i.e. a thickness of about 1.2 to 1.5 times of the thickness of the poly silicon layer 340. When considering that the polysilicon layer 340 is deposited to a thickness of about 800 Å, the amorphous carbon layer 350 is preferably deposited to a thickness of at least about 1200 Å.

On the amorphous carbon layer 350, a capping layer 360 for protecting the amorphous carbon layer 350 from a subsequent exposure and development process is deposited. The capping layer 360 may be used as a layer for providing a hard mask or an etch mask in a process of selectively etching the amorphous carbon layer 350 into the partition. This capping layer 360 may be formed of a PE-TEOS layer that may be stable in a developing solution or in a photoresist ashing or strip process compared with the amorphous carbon layer 350, but it is more preferable that the capping layer is formed of a SiON layer when the spacer is formed of SiN.

While the etch selectivity of the SiON layer to the amorphous carbon layer 350 can be obtained to as high as about 10:1, the etch selectivity of the photoresist layer to the amorphous carbon layer 350 is preferably about 1:1. Therefore, the capping layer 360 can actually act as an etch mask. As such, since the capping layer 360 of the SiON layer can act as a hard mask that realizes a high etch selectivity, the amorphous carbon layer 350 can be introduced in a relatively high thickness of a level required in the SPT process. In a material, such as the polysilicon layer, that has a poor etch selectivity to the photoresist, etc., it is difficult to pattern by a selective etch and thus realize the partition having a desired height when the material is introduced in a thickness as thick as the amorphous carbon layer 350. In comparison, since the amorphous carbon layer 350 can be accurately patterned due to its high etch selectivity even though it is deposited in a relatively high thickness, it is effective to realize the high partition required in the SPT.

Meanwhile, when the capping layer 360 is formed of an SiON layer and the spacer is formed of SiN, it is possible to remove the portion of the capping layer 360 as well that remains on the amorphous carbon layer 350 in a spacer etch process for forming the spacer. This capping layer 360 is preferably formed in a thickness of about 300 Å though the thickness thereof may vary in consideration of the thickness of the amorphous carbon layer 350.

An Anti-Reflective Coating (ARC) 370 is formed on the capping layer 360 to restrict a scattered reflection by the lower film during an exposure process. This ARC 370 is preferably formed to a thickness of about 240 Å as a Bottom ARC (BARC). A first photoresist layer is applied onto the BARC and the layout of the designed partition 210 in FIG. 2 is exposed and transcribed onto the first photoresist layer. At this time, the pattern transcription process using an exposure is preferably performed in an exposure process using ArF light source. The first photoresist layer is preferably formed to a thickness of about 1200 Å in consideration of an effective exposure depth of the ArF light source. The exposed first photoresist layer is developed to form a first photoresist pattern 380. This photoresist pattern 380 comes to have a layout that follows the layout of the partition in FIG. 2.

Since the height of the first photoresist pattern 380 depends on the thickness of the first photoresist layer in which the exposure by the ArF light source is effective, the height of the first photoresist pattern 380 is limited. Therefore, the thickness of the amorphous carbon layer 350 that will be selectively etched using the first photoresist pattern 380 as an etch mask may also be limited. Nevertheless, in an embodiment of the invention, the amorphous carbon layer 350 is preferably deposited to a thickness of at least about 1200 Å to lead the spacer to be formed to a height effective to the SPT process.

Figure 4:
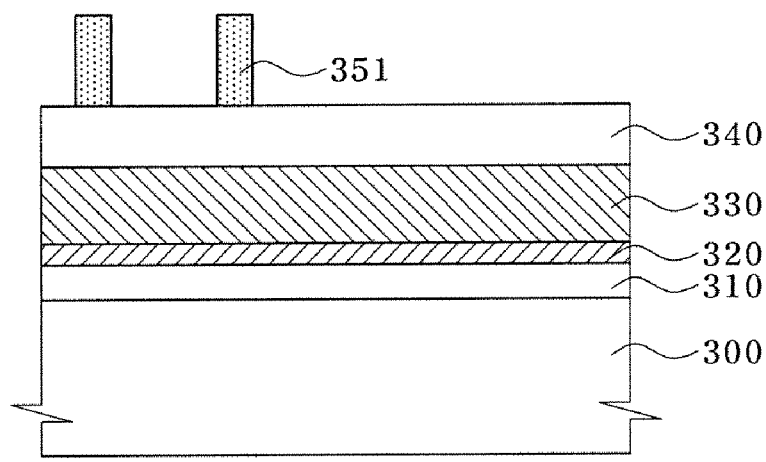

Referring to FIG. 4, the amorphous carbon layer 350 is selectively etched using the photoresist pattern (380 in FIG.

3) as the etch mask to form an amorphous carbon layer pattern that follows the layout of the partition 210 in FIG. 2 as the pattern of the partition 351. Using the first photoresist pattern 380 as the etch mask, the ARC 370 is selectively etched and then the capping layer of SiON layer exposed according to the selective etch of the ARC 370 is selectively etched. After that, the amorphous carbon layer 350 exposed by the selective etch of the capping layer 360 is selectively etched to form the pattern of the partition 351.

During this etch process, the pattern of the capping layer 360 acts as an etch mask or hard mask for the selective etch of the amorphous carbon layer 350. Therefore, in spite that the etch selectivity of the first photoresist pattern 380 and the amorphous carbon layer 350 is about 1:1, the amorphous carbon layer 350 is effectively patterned to the partition 351 due to the action of the SiON layer introduced into the capping layer 360 as the hard mask. Meanwhile, during this etch process, the first photoresist pattern 380 and the ARC 370 are consumed and removed. A wet cleaning process for removing the pattern of the capping layer 360 may be introduced since the pattern of the capping layer 360 may remain, but it may be possible to omit this cleaning process in order to maintain the partition 351 at higher height and thus raise the height of the spacer.

Figure 5:
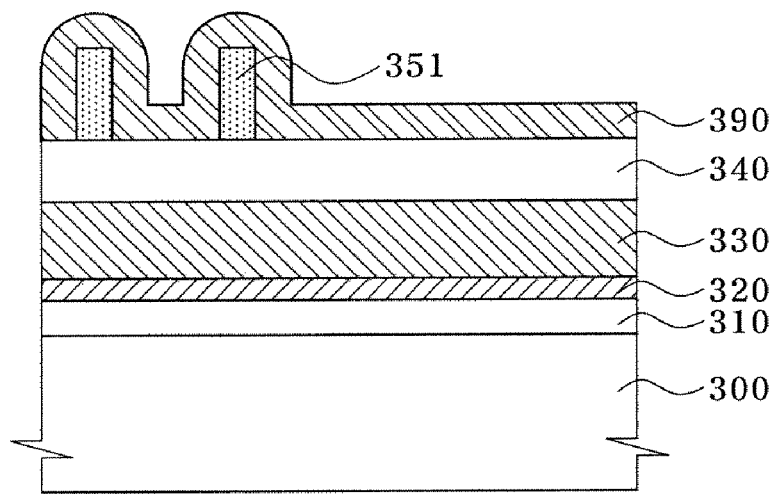

Referring to FIG. 5, a spacer layer 390 is formed that is elongated so as to cover the surface of the poly silicon layer 340 exposed according to the formation of the partition and cover the sidewall and upper surface of the partition 351. The spacer layer 390 is preferably deposited as an SiN layer capable of having an etch selectivity to the amorphous carbon layer 350 that forms the partition 351 and the polysilicon layer 340 thereunder. At this time, the thickness of the SiN layer is set in consideration of the target line width of the fine pattern. For example, when considering that the target line width of the fine pattern is 40 nm, the thickness of the SION layer may be set so that the line width of a portion attached to the sidewall of the partition 351 is about 40 nm. In fact, when the line width of the spacer is measured to be 42.1 nm, the resultant line width of the fine pattern is measured to be about 39.6 nm.

Figure 6:
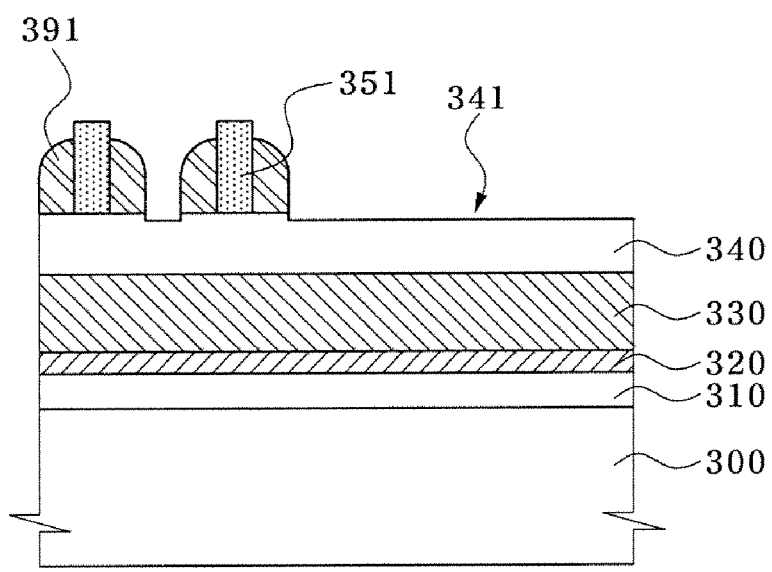

Referring to FIG. 6, a spacer etch such as an anisotropic dry etch, for example, is performed on the spacer layer 390 to form a spacer attached to the sidewall of the partition 351. This spacer 391 comes to have a shape that follows the layout of the spacer 200 in FIG. 2. During this etch process, residue of the capping layer that may remain on top of the partition 351 can be removed together. The surface 341 of the polysilicon layer 340 exposed by the spacer etch may be partially recessed.

Figure 7:
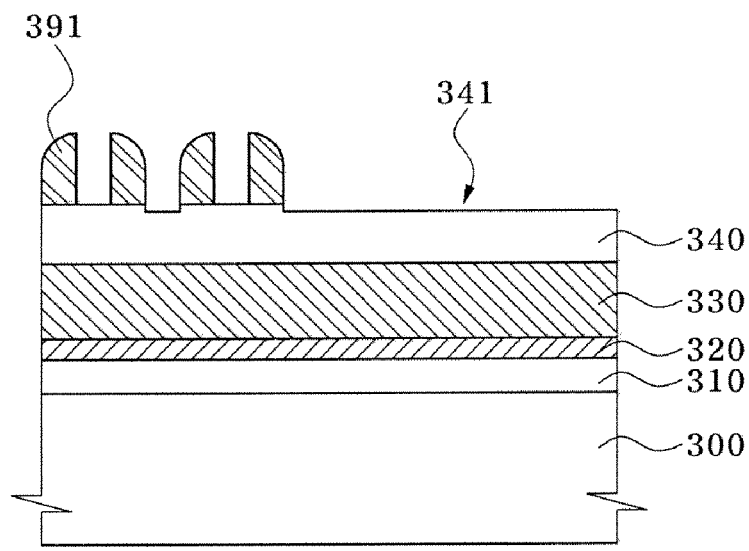

Referring to FIG. 7, the partition 351 with the spacer 391 attached to the sidewall thereof is selectively removed. Since the partition 351 is formed of amorphous carbon, the partition 351 can be selectively removed by ashing, etc.

Figure 8:
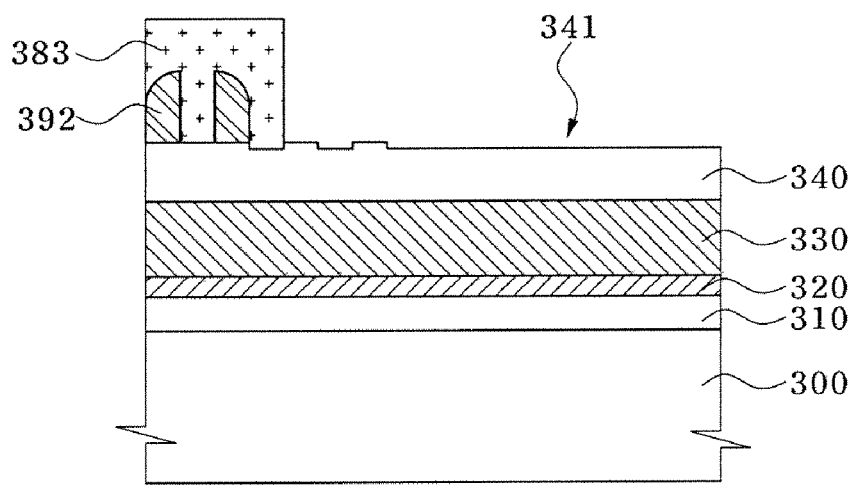

Referring to FIG. 8, a second photoresist pattern 383 is formed that covers some portion of the spacer 391 and exposes other portion of the spacer 391. At this time, s shown in FIG. 2, the second photoresist pattern 383 is formed to a mask provided with the opening region 230 that opens the end portion of the spacer (220 in FIG. 2). Therefore, the portion of the spacer 391 exposed by the second photoresist pattern 383 corresponds to the end portion 221 of the spacer in FIG. 2. Using this second photoresist pattern 383 as an etch mask, the exposed portion of the spacer 391 is selectively etched and removed. Accordingly, the end of the spacer 391 is cutting etched and thus is divided into two parallel elongated bar patterns 392 having a shape that follows the layout of the gate 110 shown in FIG. 1.

Figure 9:
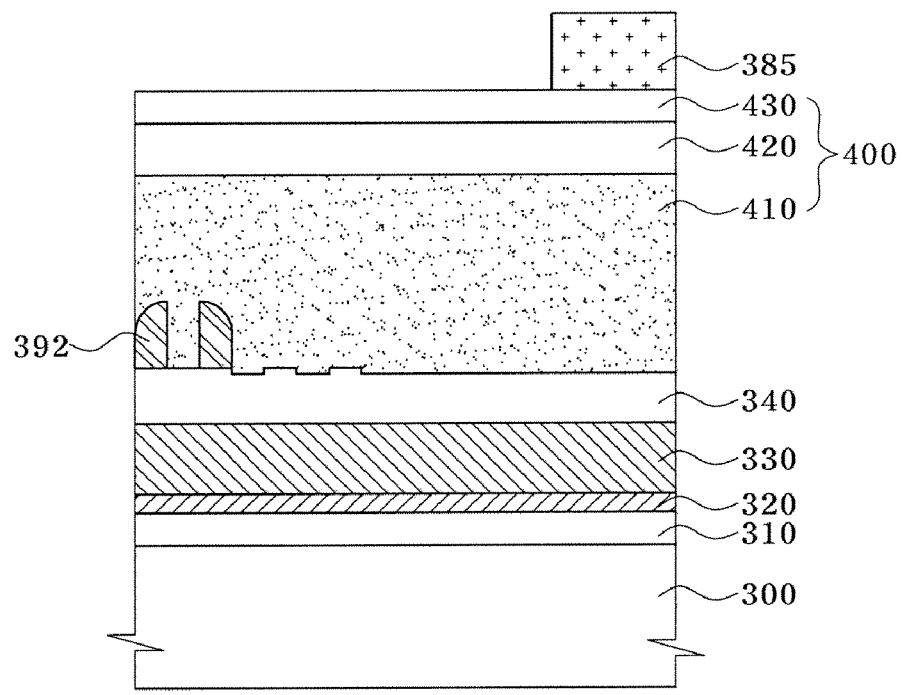

Referring to FIG. 9, a hard mask layer 400 is formed that covers the bar pattern 392 and the polysilicon layer 340. The hard mask layer 400 is introduced to form a pad mask pattern for forming the contact pad 120 shown in FIG. 1. This hard mask layer 400 is preferably formed as a Spin On Carbon (SOC) layer 410 that covers the bar pattern 392 and the polysilicon layer 340. After the SOC layer 410 is applied, a suitable silicon polymer layer 420 for providing an etch mask or a hard mask for the SOC layer 410 is applied onto the SOC layer 410.

The silicon polymer layer 420 is preferably a polymer or resin comprising silicon atoms, and is introduced as a Multi Functional Hard Mask (MFHM) layer that not only functions as an ARC but also functions as an etch mask or a hard mask. After that, a third photoresist pattern 385 is formed on the silicon polymer layer 420 that is an MFHM layer. The third photoresist pattern 385 is formed as a mask for the contact pad 120 shown in FIG. 1. At this time, an interlayer for restricting that the silicon polymer layer 420 from is influenced by an application, exposure, and development process for forming the third photoresist pattern 385 may be further formed as a second buffer layer, at the interface between the third photoresist pattern 385 and the silicon polymer layer 420.

Figure 10:
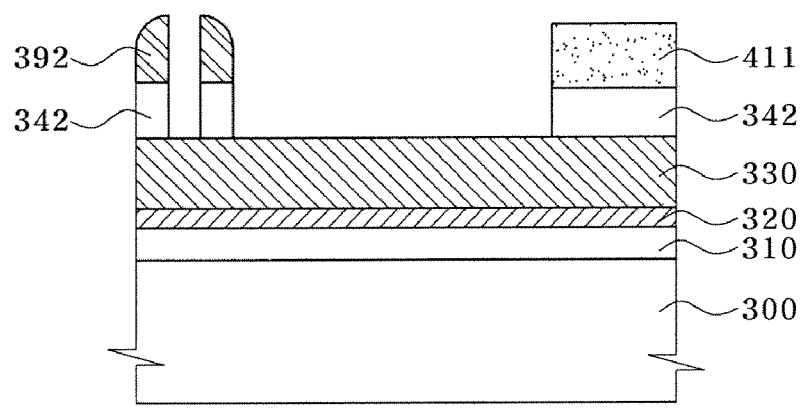

Referring to FIG. 10, the silicon polymer layer 420 that is an MFHM layer and the SOC layer 410 thereunder are selectively etched using the third photoresist pattern 385 as an etch mask to form a pad mask pattern 411 comprising the SOC layer 410. The silicon polymer layer 420 is selectively etched using the third photoresist pattern 385 as an etch mask, and resulting exposed SOC layer 410 is selectively etched using the etched silicon polymer layer 420 to form the pad mask pattern 411. This pad mask pattern 411 formed as described above comes to have a layout that follows the layout of the contact pad 120 in FIG. 1.

Subsequently, using the divided bar patterns 392 and the pad mask pattern 411 as an etch mask, the polysilicon layer 340 is selectively etched to form a polysilicon pattern 342.

Figure 11:
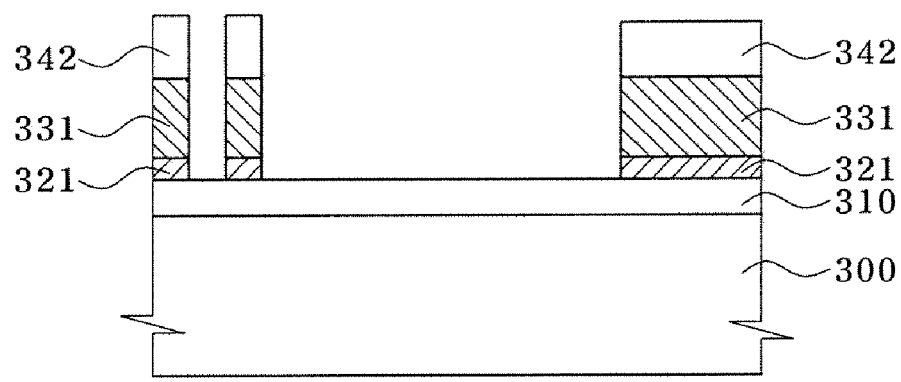

Referring to FIG. 11, using the polysilicon layer pattern 342 as an etch mask, the target layer (330 in FIG. 10) is selectively etched to form a target layer pattern 331. At this time, the portion of the first buffer layer (320 in FIG. 10) exposed by the etch of the target layer pattern 331 may also be etched to form a first buffer layer pattern 321. The target layer pattern 331 is patterned so as to have the layout of the gate line 110 and the contact pad 120 shown in FIG. 1.

Figure 12:
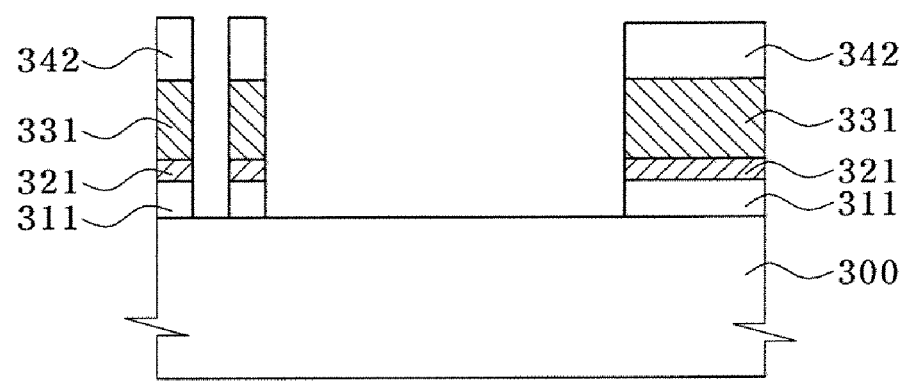

Referring to FIG. 12, using the target layer pattern 331, the conductive layer (310 in FIG. 11) is selectively etched to form a conductive layer pattern 311 the conductive layer pattern 311 is patterned so as to have the layout of the gate line 110 and the contact pad 120 shown in FIG. 1.

As is apparent form the foregoing description, in an embodiment of the invention, an entire stack for a hard mask layer to be transcribed with a layout of a spacer and a partition to be attached with the spacer can be formed in a three-layer structure including a polysilicon layer, an amorphous carbon layer, and a capping layer, preferably of SiON. Therefore, it is possible to effectively reduce a number of layers of the stack required in realization of SPT. Also, in an embodiment of the invention, it is possible to restrict excessive thermal stress applied to the amorphous carbon layer since deposition of the polysilicon layer is performed prior to deposition of the amorphous carbon layer. Therefore, it is possible to restrict degradation of film quality, by which the amorphous carbon layer is lifted. Consequently, it is possible to more accurately form a fine pattern having a line width of 40 nm level by performing a stable SPT process.

While the invention has been described with respect to the specific embodiments, various changes and modifications may be made without departing from the spirit and scope of the invention as defined in the following claims.

What is claimed is:

1. A method for forming a fine pattern, the method comprising:
   forming a target layer to be patterned over a semiconductor substrate;
   forming a polysilicon layer over the target layer;
   forming partitions on the polysilicon layer with amorphous carbon layer patterns;
   forming a spacer to the sidewall of the partitions;
   selectively removing the partitions;
   dividing the spacer into bar patterns by selectively removing an end portion of the spacer;
   forming pad mask patterns connected to end portions of the bar patterns on a portion of the polysilicon layer beside the divided bar patterns;
   forming polysilicon layer patterns by selectively etching portions of the polysilicon layer exposed by the divided bar patterns and the pad mask patterns; and
   forming target layer patterns by selectively etching portions of the target layer exposed by the polysilicon layer patterns,
   wherein the bar patterns are formed for patterning gate lines and the pad mask patterns are formed for patterning contact pads, wherein the pad mask pattern is wider than the bar patterns.

2. The method of claim 1, wherein the target layer comprises a plasma enhanced tetraethylothosilicate (PE-TEOS) layer.

3. The method of claim 1, wherein forming the amorphous carbon layer patterns comprises:
   forming an amorphous carbon layer on the polysilicon layer;
   forming a capping layer of silicon oxynitride (SiON) on the amorphous carbon layer;
   forming an antireflective layer on the capping layer;
   forming first photoresist patterns over the antireflective layer; and
   forming the amorphous carbon layer patterns by selectively etching the capping layer and the amorphous carbon layer using the first photoresist patterns as an etch mask.

4. The method of claim 1, wherein forming the pad mask pattern comprises:
   forming a Spin On Carbon (SOC) layer that covers the bar patterns and the polysilicon layer;
   forming a Multi Functional Hard Mask (MFHM) layer comprising a silicon polymer layer on the SOC layer;
   forming a second photoresist pattern over the MFHM layer; and
   forming the pad mask pattern comprising the SOC layer by selectively etching the MFHM layer and the SOC layer using the second photoresist pattern as an etch mask.

5. The method of claim 1, wherein the pad mask pattern is elongated in a direction perpendicular to the gate line.

6. The method of claim 2, comprising forming the polysilicon layer in a thickness of ⅓ to ½ compared to the thickness of the plasma enhanced tetraethylothosilicate (PE-TEOS) layer.

7. The method of claim 6, comprising forming the amorphous carbon layer pattern in a thickness of 1.2 to 1.5 times the thickness of the polysilicon layer.

* * * * *